United States Patent [19]

Golubic

[11] Patent Number: 4,801,992
[45] Date of Patent: Jan. 31, 1989

[54] THREE DIMENSIONAL INTERCONNECTED INTEGRATED CIRCUIT

[75] Inventor: Theodore R. Golubic, Phoenix, Ariz.

[73] Assignee: Motorola Inc., Schaumburg, Ill.

[21] Appl. No.: 936,570

[22] Filed: Dec. 1, 1986

[51] Int. Cl.⁴ ............................................ H01L 27/02
[52] U.S. Cl. ........................................ 357/40; 357/55; 357/75; 361/392
[58] Field of Search ...................... 357/40, 41, 55, 75; 361/392

[56] References Cited

U.S. PATENT DOCUMENTS 3,880,493  4/1975  Lockhart, Jr. ...................... 357/51
4,295,924  10/1981  Garnache et al. ................... 357/55

*Primary Examiner*—Robert S. Macon
*Attorney, Agent, or Firm*—Dale E. Jepsen; Harry A. Wolin

[57] ABSTRACT

A three dimensional interconnected modular integrated circuit and method of manufacturing same are provided wherein the modular circuit comprises individual planar integrated circuits which are connected together and to an interconnect chip for mounting on a lead line package resulting in an increase in available integrated circuit surface area for a given footprint area.

16 Claims, 2 Drawing Sheets

THREE DIMENSIONAL INTERCONNECTED INTEGRATED CIRCUIT

BACKGROUND OF THE INVENTION

This invention relates, in general, to three dimensional integrated circuits. More particularly, the present invention relates to a specific configuration for three dimensional integrated circuits and a method of constructing same. In order to increase circuit density, semiconductor manufacturers have continued to reduce the size of various integrated circuit elements and interconnections to the point where the limits of current technology are being reached. In order to decrease run length and increase circuit density, various methods have been explored to interconnect a plurality of integrated circuit chips without the use of a circuit board. Some of the methods proposed to date include wafer scale integration, stacking individual devices horizontally and stacking individual devices vertically.

It would, therefore, be advantageous to combine a number of integrated circuits in a three dimensional interconnected module such that for a given device footprint the total integrated circuit surface area would increase by a factor of 2, 3, 4 or more. This increased circuit area could be used to either add additional functions to a given circuit or provide redundancy in areas where desired. It would be desirable to accomplish this increase in integrated circuit area while at least retaining, if not improving, the heat dissipation capability of the original circuit. In addition, a method should be provided wherein the individual circuit elements may be easily interconnected among themselves and to any external circuits. Such an arrangement would also decrease the run length between the individual circuit chips thereby reducing both the power required for transmitting signals between the individual chips and the time required for such signals to be transmitted between such chips. In those devices where run lengths are not critical, expanding the formats of existing devices would restore greater line widths and therefore result in greater yields.

SUMMARY OF THE INVENTION

Accordingly, it is an object of the present invention to provide a three dimensional interconnected modular integrated circuit.

It is a further object of the present invention to provide a modular integrated circuit having increased circuit density for a given available mounting surface area.

A still further object of the present invention is to provide a modular integrated circuit having a cooling capacity at least equal to that of a flat integrated circuit having the same mounting surface area.

Yet another object of the present invention is to provide a method for interconnecting a number of separate or combined discrete and/or integrated circuit chips which results in increased circuit density, reduced interconnect lengths, improved heat dissipation, and reduced board count or size.

The foregoing and other objects are achieved in the present invention wherein there is provided a method of constructing a three dimensional modular integrated circuit on a wafer, forming moat regions between individual integrated circuits and filling said moat regions with isolation regions. Conductive material is applied to each individual integrated circuit in specific patterns in order to bring interconnection lines across said moat regions.

The wafers containing the individual circuits are then cut along the surface opposite the moat regions with a saw blade having a 90 degree included angle in order to form 45 degree beveled edges on the edges of the individual integrated circuit chips. The individual chips are then assembled on a hollow core such that the 45 degree beveled edges of adjacent chips are aligned.

The individual chips are bonded to the hollow core and the conductive lines are connected at adjacent corners. A fifth chip having bumped connections is connected to the cube resulting from interconnecting four of the individual circuit chips around the hollow core. The edges of the bumped chip are beveled at a 45 degree angle to mate with the four integrated circuit chips and their corresponding conductive lines. The resultant cube shaped integrated circuit has a circuit surface area four times that of one of the individual circuit chips but has the same footprint area as one individual chip.

BRIEF DESCRIPTION OF THE DRAWINGS

The above-mentioned and other features and objects of the present invention and the manner of obtaining them will become apparent and the invention itself will be best understood by reference to the following description of an embodiment of the invention taken in conjunction with the accompanying drawings, wherein.

DESCRIPTION OF A PREFERRED EMBODIMENT

Figure 1:
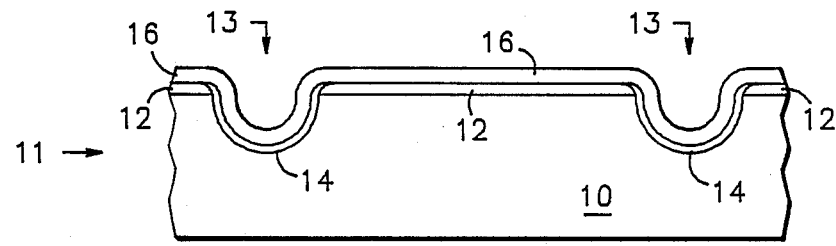
FIG. 1 is an enlarged cross-sectional view illustrating a portion of a wafer having integrated circuits and moat regions used in accordance with the present invention.

The three dimensional integrated circuit of the present invention comprises individual integrated circuit chips which are formed and assembled in the following manner:

As shown in FIG. 1, individual integrated circuit chips are formed on substrate 10 of wafer 11 in a manner known to those skilled in the art. Integrated circuit region 12, while shown as a single layer, may consist of multiple layers as required to produce the desired integrated circuit. It is also contemplated that integrated circuit region 12 may consist of a single discrete device. Moat regions 13 are formed in substrate 10 by conventional means such as etching. Moat region 13 is then filled with isolation material to form isolation region 14. Once the individual integrated circuits 12 have been formed, conductive material is applied in specific patterns as desired in order to bring interconnection lines across moat region 13. This conductive material is shown, for example as metal line 16 in FIG. 1.

Once the individual integrated chips have been formed on wafer 11, as shown in FIG. 1, the wafer is inverted and may be attached to a mylar layer 18 in order to facilitate handling. Individual circuit chips 19 are then formed by cutting the wafer 11 along moat regions 13 which were created as described above. The included angle of the edge of the saw blade 20 should be as required to form the appropriate miter angle between adjacent circuit chips when they have been mounted into the cube. In the case of a four sided cubic arrangement as shown in FIG. 4, the angle of this edge of the saw blade should be 90° to produce a 45° angle on the adjoining edges of each of the adjacent individual circuit chips.

Figure 3:
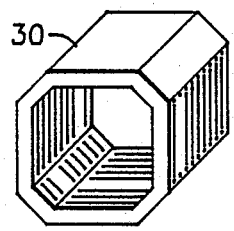
FIG. 3 is an isometric view of a hollow core used to support the individual integrated circuit chips.

The individual circuit chips 19 thus produced are then assembled together over a hollow core such as that shown in FIG. 3. This core may provide both a mounting surface for the individual circuit chips and a heat transfer device for dissipating heat from the individual circuit chips. As shown in FIG. 4, the individual chips 19 are mounted such that the 45° bevelled edges contact each other and the conducting lines of adjacent individual circuit chips are aligned.

Figure 2:
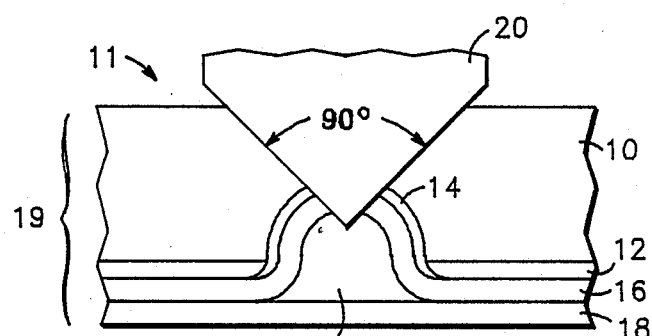
FIG. 2 is an enlarged cross-sectional view illustrating the sawing of the substrate at the moat region.
Figure 4:
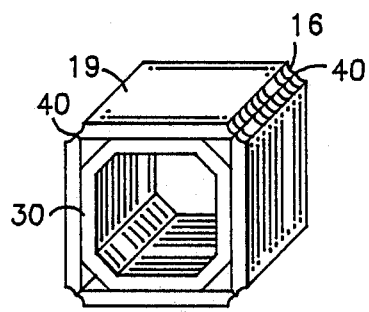
FIG. 4 is an isometric view of the hollow core and the attached integrated circuit chips.

As illustrated in FIG. 4, the individual chips 19 are bonded to the hollow core using epoxy or the like. While the individual chips 19 need not be identical the mating edges along corner 40 should be of the same length and the conducting lines 16 should be arranged to align with those of an adjacent chip. The conductive lines 16 from each chip may be connected at adjacent corners using conductive paste, laser fusion, arc spot weld or ultrasonic weld. In an alternative embodiment the individual circuit chips 19 are simply attached to each other at adjacent corners using an adhesive means and the hollow core 30 is not used. In yet another embodiment, first, second, third and fourth individual circuit elements 19 are laid out in a linear fashion along wafer 11 and the cut illustrated in FIG. 2 is made to extend only through isolation layer 14 and not through metal line layer 16. Thus, adjacent circuit elements 19 may be connected simply by folding into the cube shape using intact metal lines 16 as a hinge at three adjacent corners. The remaining fourth corner must then be fastened as indicated above using any conventional adhesive means.

The four integrated circuit chips 19 thus assembled are now attached to a fifth side of a cube which comprises a bumped chip with various interconnect lines to the other four integrated circuit chips. Again the conducting lines 16 on each of the four integrated circuits chips are connected to the bumped chip using conductive paste, laser fusion, arc spot weld or ultrasonic weld. The resultant integrated circuit cube 45 comprises four separate integrated circuit chips which are interconnected both among themselves and to the bumped chip which forms the fifth side of a modular integrated circuit.

Figure 6:
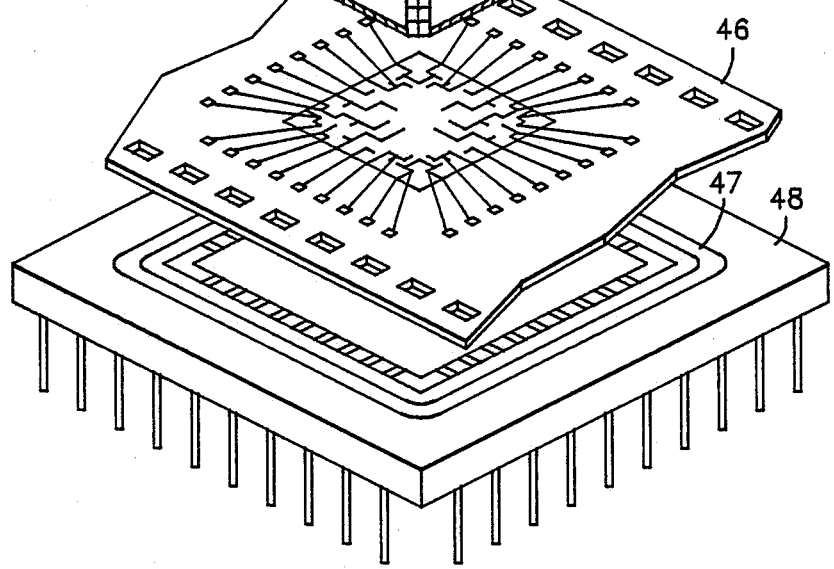
FIG. 6 illustrates tape automated bonding as a method for assembling the integrated circuit module.

FIG. 6 illustrates tape automated bonding as one method for assembling the thus assembled integrated circuit module to a conventional lead package. Integrated circuit cube 45 is bump mounted to a laminated area array tape 46 which is in turn mounted to lead line package 48. In the alternative integrated circuit cube 45 could be surface mounted to a lead line area array integrated into a board or hybrid-like layered substrate.

Figure 8:
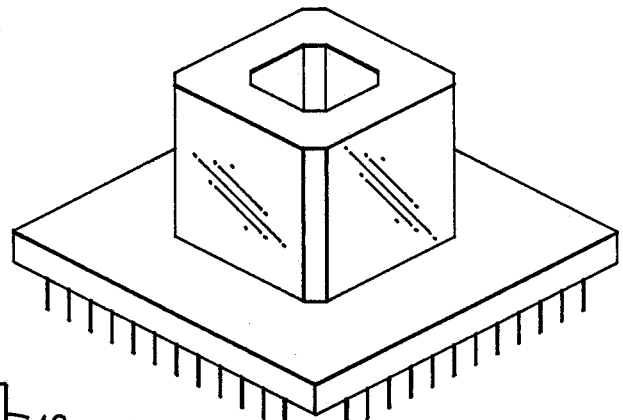
FIG. 8 is an isometric view of a completed cube integrated circuit module.
Figure 7:
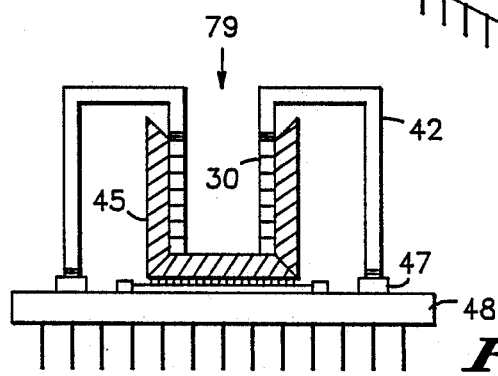
FIG. 7 is a cross-sectional view illustrating the integrated circuit cube bonded to a package.
Figure 5:
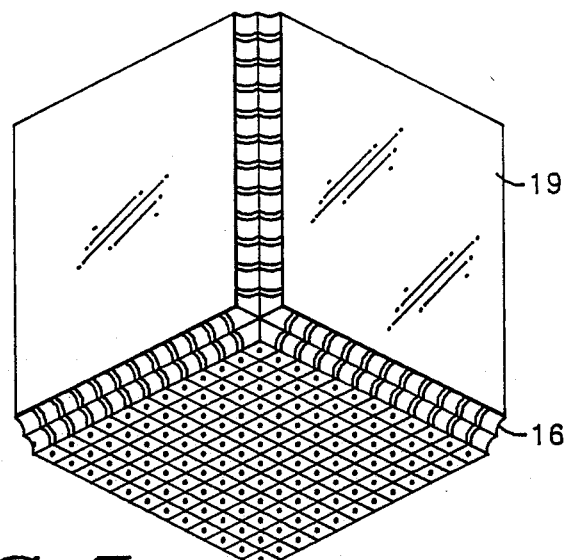
FIG. 5 is an isometric view of a portion of an assembled cube module showing the bumped chip.

In FIG. 7 there is shown the assembled integrated circuit cube 45 mounted to lead line package 48. In addition there is shown cap 42 which contacts core 30 and package seal ring 47 and provides a heat conduction path to lead line package 48. The opening of core 30 remains as an additional method for cooling of integrated circuit cube 45. In addition to providing a heat conduction path, cap 42 may also provide a method of physically and hermetically protecting the integrated circuits mounted on cube 45. The completed circuit module is as shown in FIG. 8. This completed circuit module will provide four times the circuit area of a flat integrated circuit mounted on the same package.

Alternative embodiments could be utilized to provide either two or three times the circuit area of a footprint by altering the geometric configuration. For example, a tent-shaped configuration could be utilized wherein the two sides of the tent would be separate integrated circuit chips 19 and the floor of the tent would be a bumped chip. In a similar fashion the four sided box, similar to that of FIG. 4, could be utilized wherein three of the sides of the box are separate integrated circuit elements 19 and the fourth side of the box is a bumped chip which is mounted to the lead line package. Likewise, there could be alternative embodiments with five or more separate integrated circuit elements arranged in various geometric configurations.

The above description is given by way of example only. Changes in form and details may be made by one skilled in the art without departing from scope of the invention.

I claim:

1. A modular integrated circuit comprising a plurality of planar integrated circuits, each having at least two edges, joined at adjacent edges thereof wherein each of said planar integrated circuits contains a plurality of conductors formed therein and extending to at least one of said edges thereof for connecting said conductors of each of said planar integrated circuits to the conductors of at least one adjacent planar integrated circuit.

2. The modular integrated circuit of claim 1 wherein said planar integrated circuits are rectangular shaped 3. The modular integrated circuit of claim 2 comprising four of said planar integrated circuits connected to form a four-sided rectangular box.

4. The modular integrated circuit of claim 1 further comprising interconnect means for coupling at least one of the conductors from at least one edge of one of said planar integrated circuits to a lead package.

5. The modular integrated circuit of claim 4 wherein said interconnect means comprises a bumped chip.

6. The modular integrated circuit of claim 5 wherein said interconnect means further comprises a laminated area array tape.

7. The modular integrated circuit of claim 4 further comprising a lead package coupled to said interconnect means.

8. The modular integrated circuit of claim 7 further comprising a heat sink coupled to said planar integrated circuits.

9. A method for manufacturing a modular integrated circuit comprising the steps of:
    forming a plurality of planar integrated circuits, each having a plurality of conductors extending to at least one edge thereof, on a plurality of wafers;
    cutting said wafers into individual planar integrated circuits; and
    connecting adjacent edges, and the conductors which extend thereto, of at least two of said planar integrated circuits to form a modular integrated circuit.

10. The method of claim 9 wherein said cutting step comprises sawing said wafers with a saw blade having an edge shaped to form cut edges on said planar integrated circuits such that when adjacent edges of said planar integrated circuits are joined a bevel joint is formed.

11. The method of claim 9 further comprising the step of connecting at least one edge of an interconnect chip, having at least one edge and a plurality of conductors extending to said at least one edge thereof, to at least one edge of at least one of said planar integrated circuits such that said conductors of said interconnect chip are connected to conductors of said at least one planar integrated circuit.

12. The method of claim 11 further comprising the step of connecting a lead package to said interconnect chip.

13. A method for manufacturing a modular integrated circuit comprising the steps of:

forming a plurality of adjacent planar integrated circuits, having at least one common edge and at least two other edges thereof, on a single wafer wherein each of said planar integrated circuits contains a plurality of conductors extending across said at least one common edge thereof to connect to an adjacent planar integrated circuit;

cutting said wafer along said at least one common edge and along said at least two other edges of said plurality of planar integrated circuits such that said plurality of conductors remains intact across said at least one common edge;

folding said plurality of planar integrated circuits along said at least one common edge; and connecting said at least two other edges to form a modular integrated circuit.

14. The method of claim 13 wherein said cutting step comprises sawing with a saw blade having an edge shaped to form cut edges on said planar integrated circuits such that when said fold is made along said common edge and when said at least two other edges are connected, bevel joints are formed.

15. The method of claim 13 further comprising the step of connecting at least one edge of an interconnect chip, having at least one edge and a plurality of conductors extending to said at least one edge thereof, to at least one edge of at least one of said planar integrated circuits such that said conductors of said interconnect chip are connected to conductors of said at least one planar integrated circuit.

16. The method of claim 15 further comprising the step of connecting a lead package to said interconnect chip.

* * * * *